(12) United States Patent
Chang et al.

(10) Patent No.: US 7,714,396 B2
(45) Date of Patent: May 11, 2010

(54) METAL-OXIDE SEMICONDUCTOR FIELD EFFECT TRANSISTOR

(75) Inventors: Tzu-Yun Chang, Hsinchu County (TW); Chen-Hua Tsai, Hsinchu County (TW); Po-Wei Liu, Taichung (TW); Cheng-Tzung Tsai, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 779 days.

(21) Appl. No.: 11/309,167

(22) Filed: Jul. 5, 2006

(65) Prior Publication Data

US 2008/0009110 A1    Jan. 10, 2008

(51) Int. Cl.
*H01L 27/088* (2006.01)

(52) U.S. Cl. ........................................... 257/401

(58) Field of Classification Search .................. None
See application file for complete search history.

(56) References Cited

U.S. PATENT DOCUMENTS

| 6,252,277 | B1 | 6/2001 | Chan et al. | |
| 6,504,214 | B1 * | 1/2003 | Yu et al. | 257/347 |
| 7,190,050 | B2 * | 3/2007 | King et al. | 257/622 |
| 7,247,887 | B2 * | 7/2007 | King et al. | 257/139 |
| 7,265,008 | B2 * | 9/2007 | King et al. | 438/197 |
| 2005/0093084 | A1 * | 5/2005 | Wang et al. | 257/410 |
| 2006/0081875 | A1 | 4/2006 | Lin et al. | |
| 2007/0001232 | A1 * | 1/2007 | King et al. | 257/368 |
| 2007/0001237 | A1 * | 1/2007 | King et al. | 257/401 |
| 2007/0004113 | A1 * | 1/2007 | King et al. | 438/197 |
| 2007/0145487 | A1 * | 6/2007 | Kavalieros et al. | 257/368 |
| 2008/0057712 | A1 * | 3/2008 | Liu | 438/689 |

* cited by examiner

*Primary Examiner*—David E Graybill
(74) *Attorney, Agent, or Firm*—Chun-Ming Shih

(57) ABSTRACT

The invention is directed to a method for forming a metal-oxide semiconductor field effect transistor. The method comprises steps of providing a substrate having a gate structure formed thereon, wherein a plurality of isolation structures are located in the substrate adjacent to both sides of the gate structure and then forming a first spacer on the sidewall of the gate structure. A portion of the substrate between the first spacer and the isolation structures is removed to form a recession and a source/drain layer is deposited in the recession, wherein the top surface of the source/drain layer is higher than the top surfaces of the isolation structures. A second spacer is formed on the isolation structures and at the sidewall of the source/drain layer and a metal silicide layer is formed on the source/drain layer.

6 Claims, 12 Drawing Sheets

METAL-OXIDE SEMICONDUCTOR FIELD EFFECT TRANSISTOR

BACKGROUND OF THE INVENTION

1. Field of Invention

The present invention relates to a metal-oxide semiconductor field effect transistor and a method for forming the same. More particularly, the present invention relates to a metal-oxide semiconductor field effect transistor having a strained layer and a method for forming the same.

2. Description of Related Art

Since the metal-oxide semiconductor field effect transistor possesses the superiority features such as, high reliability, low power consumption and low cost, it becomes the most important device in the integrated circuit. Typical metal-oxide semiconductor field effect transistor is formed on a silicon substrate and has a gate electrode, a source/drain region and a gate dielectric layer located between the gate electrode and the substrate. With the development of the electronic equipment such as telecommunication equipment, it is necessary to speed up the operation of the metal-oxide semiconductor field effect transistor. However, the application of the metal-oxide semiconductor field effect transistor is limited by the moving rate of the electrons and the holes within silicon.

Conventional, a metal-oxide semiconductor field effect transistor is provided to use germanium silicon epitaxy material to form the source/drain region so as to improve the moving rate of the electrons and the holes. Comparing to silicon, germanium possesses relatively smaller electron effective mass and hole effective mass so that the germanium silicon material can improve the electron migration probability and the hole migration probability. Moreover, since the lattice constant of germanium is larger than that of silicon, the germanium silicon epitaxy possesses a functionality as a strained layer. Therefore, the germanium silicon epitaxy further improves the efficiency of the metal-oxide semiconductor field effect transistor.

Nevertheless, it is easy for the metal-oxide semiconductor field effect transistor with the use of the germanium silicon epitaxy as the source/drain region to have structure defects. FIG. 1 is a cross-sectional view of a conventional metal-oxide semiconductor field effect transistor. As shown in FIG. 1, the metal-oxide semiconductor field effect transistor comprises a substrate 100, a gate electrode 102, a gate dielectric layer 104, a source/drain region 106 and a metal silicide layer 108. The metal silicide layer is the last part formed in the structure shown in FIG. 1. The method for forming the metal silicide layer 108 includes a self-aligned silicide process (salicide process). It is easy to generate spiking phenomenon at the border between the source/drain region 106 and the isolation structure 110 by using salicide process. Therefore, the metal silicide layer 108 is in contact with the substrate 100, which leads to junction leakage.

SUMMARY OF THE INVENTION

Accordingly, at least one objective of the present invention is to provide a method for forming a metal-oxide semiconductor field effect transistor capable of preventing the metal-oxide semiconductor field effect transistor from generating spiking phenomenon.

At least another objective of the present invention is to provide a metal-oxide semiconductor field effect transistor capable of preventing the substrate from being connected to the metal silicide. That is, the problem of the junction leakage can be overcome.

To achieve these and other advantages and in accordance with the purpose of the invention, as embodied and broadly described herein, the invention provides a method for forming a metal-oxide semiconductor field effect transistor. The method comprises steps of providing a substrate having a gate structure formed thereon, wherein a plurality of isolation structures are located in the substrate adjacent to both sides of the gate structure and then forming a first spacer on the sidewall of the gate structure. A portion of the substrate between the first spacer and the isolation structures is removed to form a recession and a source/drain layer is deposited in the recession, wherein the top surface of the source/drain layer is higher than the top surfaces of the isolation structures. A second spacer is formed on the isolation structures and at the sidewall of the source/drain layer and a metal silicide layer is formed on the source/drain layer.

According to one embodiment of the present invention, before the second spacer is formed, the method further comprises removing a portion of the isolation structures to decrease the height of the isolation structures.

According to one embodiment of the present invention, the method for forming the source/drain layer includes a selective epitaxial deposition.

According to one embodiment of the present invention, the material of the source/drain layer includes germanium silicon.

According to one embodiment of the present invention, the material of the source/drain layer includes carbon silicon.

The present invention also provides a method for forming a metal-oxide semiconductor field effect transistor. The method comprises steps of providing a substrate having a gate structure formed thereon, wherein a plurality of isolation structures are located in the substrate and then removing a portion of the substrate between the gate structure and the isolation structures to form a recession. A source/drain layer is deposited in the recession, wherein the top surface of the source/drain layer is higher than the top surface of the isolation structure and a spacer is formed on the sidewall of the gate structure, the sidewall of the source/drain layer and the isolation structures. A metal silicide layer is formed on the source/drain layer.

According to one embodiment of the present invention, before spacer is formed, the method further comprises removing a portion of the isolation structures to decrease the height of the isolation structures.

According to one embodiment of the present invention, the method for forming the source/drain layer includes selective epitaxial deposition.

According to one embodiment of the present invention, the material of the source/drain layer includes germanium silicon.

According to one embodiment of the present invention, the material of the source/drain layer includes carbon silicon.

The present invention further provides a metal-oxide semiconductor field effect transistor. The metal-oxide semiconductor field effect transistor comprises a substrate, a plurality of isolation structures, a gate structure, a source/drain layer and a spacer. The isolation structures are located in the substrate and the gate structure is located on a portion of the substrate between the isolation structures. The source/drain layer is located on a portion of the substrate between the gate structure and the isolation structures, wherein the top surface of the source/drain layer is higher than the top surface of the isolation structures. The spacer is located at the sidewall of the gate structure, the sidewall of the source/drain layer and the isolation structures.

According to one embodiment of the present invention, the structure of the source/drain layer includes epitaxial structure.

According to one embodiment of the present invention, the material of the source/drain includes germanium silicon.

According to one embodiment of the present invention, the material of the source/drain includes carbon silicon.

The present invention provides a method for forming a metal-oxide semiconductor field effect transistor. The method comprises steps of providing a substrate having a first device region and a second device region, wherein the first device region and the second device region have a plurality of isolation structures and gate structures formed thereon respectively, and the first device region and the second device region are isolated from each other by the isolation structures and then forming a cap layer on the first device region. A portion of the substrate between the gate structure and the isolation structures is removed to form a recession in the second device region and a source/drain layer is deposited in the recession, wherein the top surface of the source/drain layer is higher than the top surface of the isolation structures. The cap layer and a portion of the isolation structures in the second device region are removed to decrease the height of the isolation structures. A spacer is formed on the sidewall of the source/drain layer and the isolation structures and a source/drain region, in the first device region, is formed in a portion of the substrate between the gate structure and the isolation structures. A metal silicide layer is formed on the source/drain layer.

According to one embodiment of the present invention, the method for forming the source/drain layer includes a selective epitaxial deposition.

According to one embodiment of the present invention, the material of the source/drain layer includes germanium silicon.

According to one embodiment of the present invention, the material of the source/drain layer includes carbon silicon.

In the method for forming the metal-oxide semiconductor field effect transistor of the present invention, since a spacer is formed at the sidewall of the source/drain layer and the on the isolation structures, the metal silicide is blocked from being formed at the border between the source/drain layer and the isolation structures. Therefore, the substrate can be prevented from being connected to the metal silicide layer and the junction leakage can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2E' is a structure of the metal-oxide semiconductor field effect transistor in FIG. 2E obtained by performing a manufacturing process according to another embodiment of the invention.

DESCRIPTION OF THE PREFERRED EMBODIMENTS

The First Embodiment

FIGS. 2A through 2E are cross-sectional views showing a method for forming a metal-oxide semiconductor field effect transistor according to a first embodiment of the invention.

Figure 1:
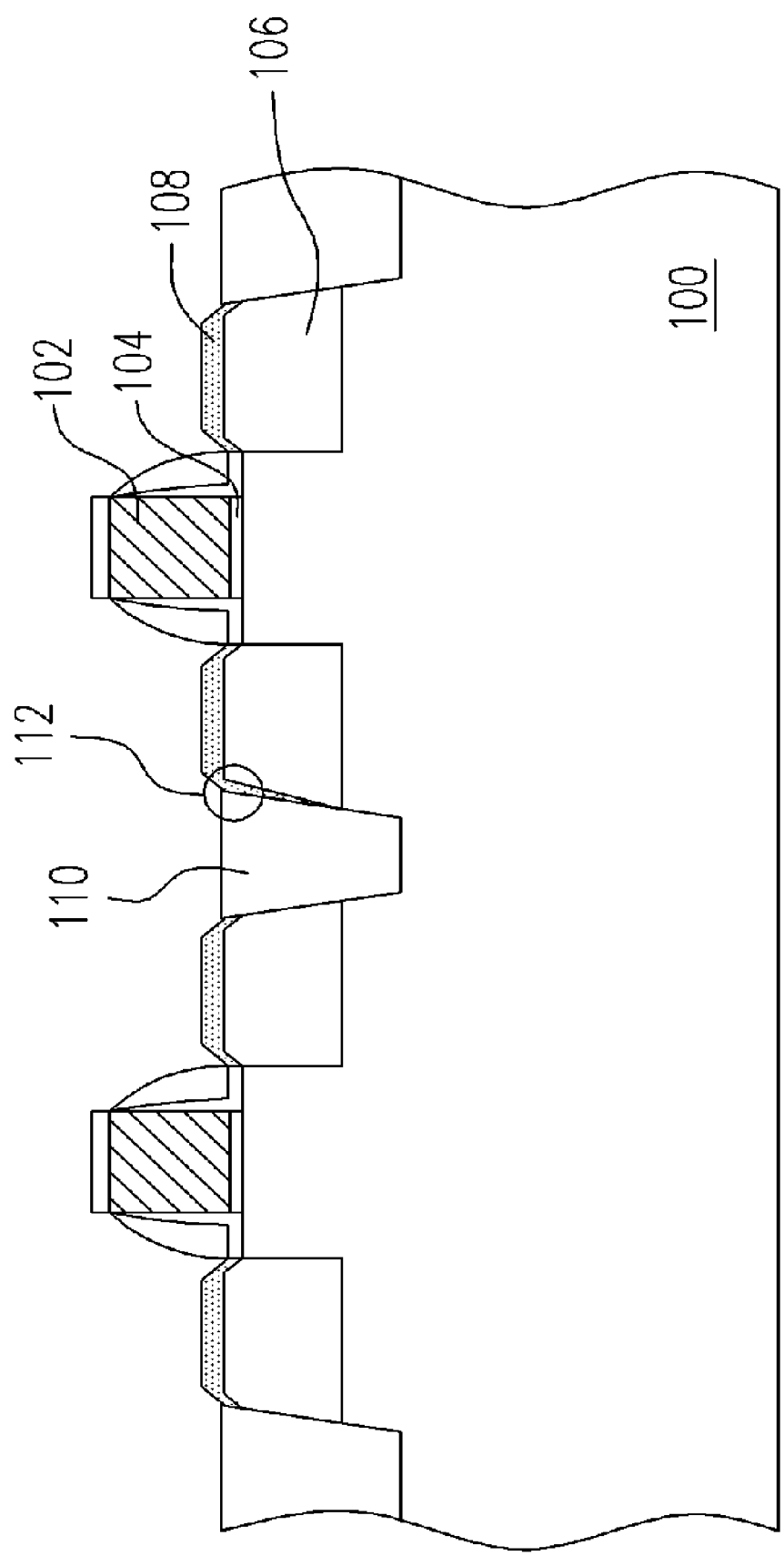
FIG. 1 is a cross-sectional view of a conventional metal-oxide semiconductor field effect transistor.
Figure 2A:
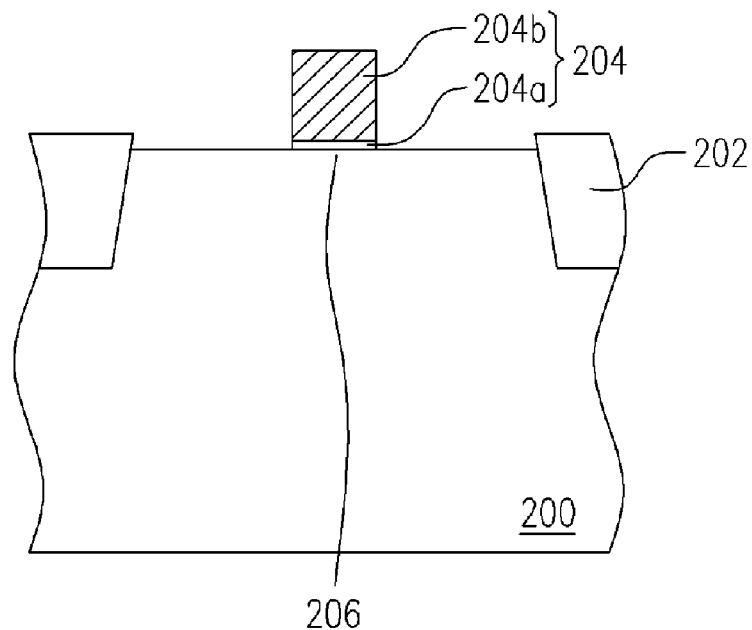
FIGS. 2A through 2E are cross-sectional views showing a method for forming a metal-oxide semiconductor field effect transistor according to a first embodiment of the invention.

As shown in FIG. 2A, a substrate 200 is provided. The substrate 200 can be, for example, a silicon based substrate. The substrate 200 has several isolation structures 202 formed thereon. The material of the isolation structures 202 can be, for example, silicon oxide. On a portion of the substrate 200 between the isolation structures 202, there is a gate structure 204. The gate structure 204 is comprised of a gate dielectric layer 204$a$ and a gate electrode 204$b$. The material of the gate dielectric layer 204$a$ can be, for example, silicon oxide and the material of the gate electrode 204$b$ can be, for example, doped polysilicon. Furthermore, a portion of the substrate under the gate structure 204 is used as a channel region 206 of the metal-oxide semiconductor field effect transistor.

Figure 2B:
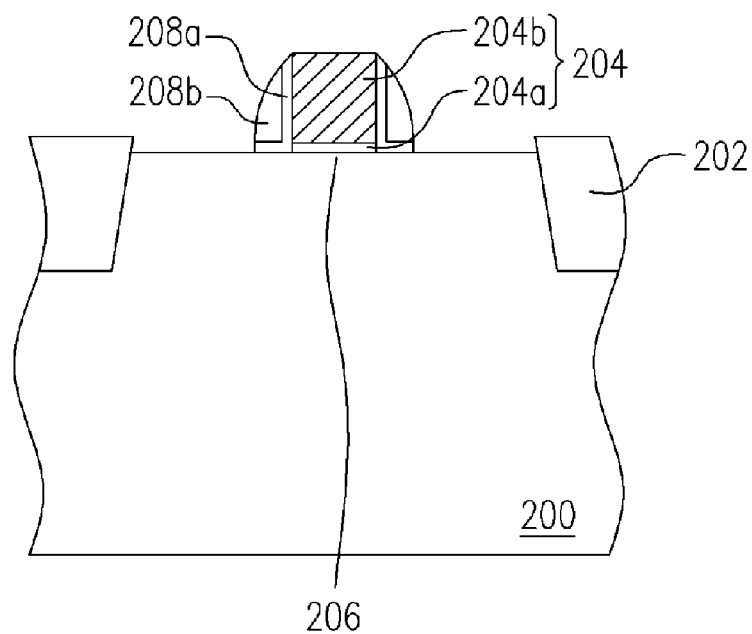
Figure 2C:
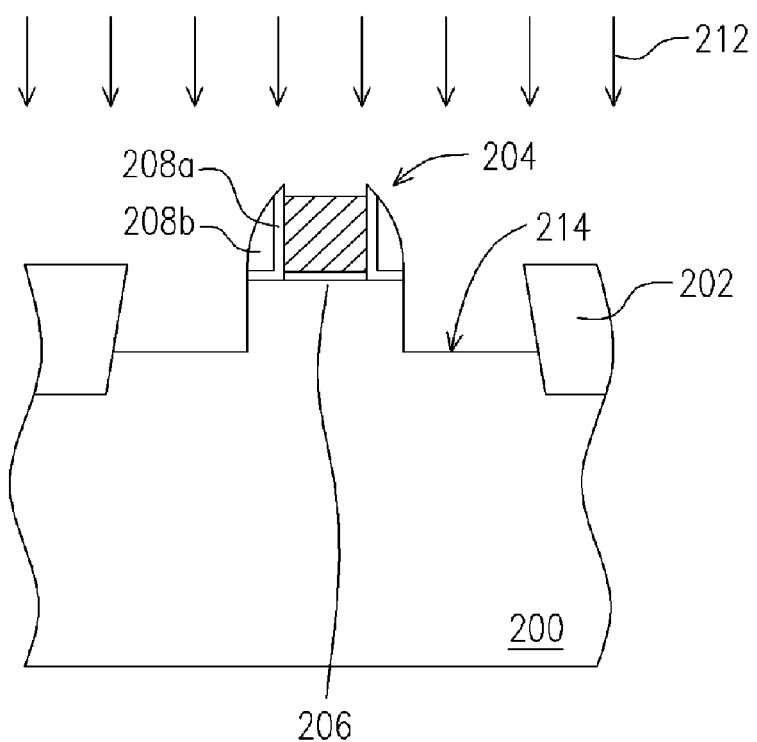

Then, as shown in FIG. 2B, an offset spacer 208$a$ is formed at the sidewall of the gate structure 204 and a first spacer 208$b$ is formed on the surface of the offset spacer 208$a$. The material of the offset spacer 208$a$ can be, for example, silicon nitride and the material of the first spacer 208$b$ can be, for example, silicon oxide or silicon nitride. The method for forming the offset spacer 208$a$ and the first spacer 208$b$ can, for example, comprises steps of depositing a silicon nitride layer (not shown) on the gate electrode 204$b$ and the substrate 200, forming an insulating layer (not shown) over the gate structure 204 and the substrate 200 and then performing an anisotropic etching process until the gate electrode 204$b$ and the substrate 200 are exposed.

Then, as shown in FIG. 2$c$, by using the gate structure 204, the offset spacer 208$a$, the first spacer 208$b$ and the isolation structures 202 as masks, a dry etching process 212 is performed to remove a portion of the substrate 200 between the first spacer 208$b$ and the isolation structures 202 to form a recession 214. The dry etching process 212 can be, for example, a reactive ion etching process and the reactive gas of the dry etching process 212 can be, for example, hexafluoroethane ($C_2F_6$) and helium. It should be noticed that a portion of the gate electrode 204$b$ of the gate structure 204 is removed during the dry etching process 212.

Figure 2D:
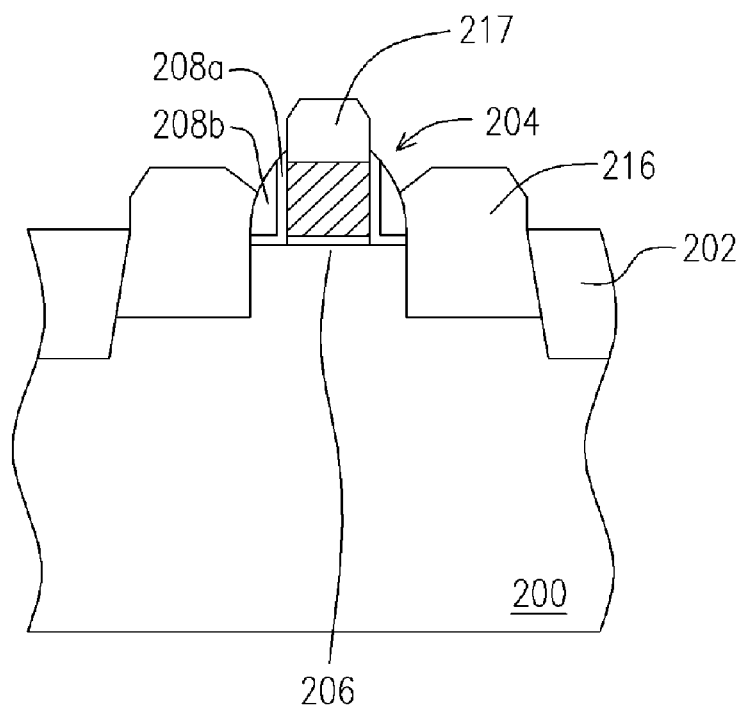

Furthermore, as shown in FIG. 2D, a source/drain layer 216 is formed in the recession 214, wherein the top surface of the source/drain layer 216 is higher than that of the isolation structures 202. In one embodiment, the method for forming the metal-oxide semiconductor field effect transistor further comprises forming a lightly doped source/drain extension region between the channel region 206 and the recession 214 to avoid the short channel effect. The method for forming the source/drain extension region can be, for example, a bevel ion implantation process.

In one embodiment, this metal-oxide semiconductor field effect transistor is a PMOS transistor and the source/drain layer 216 is made of germanium silicon. Usually, the structure of germanium silicon is represented by $Si_XGe_{1-X}$ or directly represented by SiGe, wherein the range of X is from 0 to 1. Moreover, the structure of the source/drain layer 216 can be, for example, an epitaxial structure. The method for forming the source/drain layer 216 can be, for example, a selective epitaxial deposition for growing up germanium silicon only on silicon without depositing on silicon oxide or silicon nitride. That is, germanium silicon only grows up in the recession 214 and does not grow up at the isolation structures 202, the offset spacer 208a and the first spacer 208b. Therefore, during the selective epitaxial deposition, a semiconductor layer 217 made of the material as same as that of the source/drain layer 216 is formed on the gate electrode 204b. The selective epitaxial deposition can be, for example, a vapor phase epitaxy process, such as reduced pressure chemical vapor deposition epitaxial deposition, atmosphere chemical vapor deposition epitaxy and ultra high vacuum chemical vapor deposition epitaxy. Additionally, the source/drain layer 216 can, for example, have P-type dopants therein. The P-type dopants can be, for example, in-situ implanted into the source/drain layer 216 as the source/drain layer 216 is formed. Alternatively, the P-type dopants can be, for example, non-insitu implanted into the source/drain layer 216 after the source/drain layer 216 is formed. Furthermore, the P-type dopants can be, for example, boron ions.

Additionally, as shown in FIG. 2D, in another embodiment, this metal-oxide semiconductor field effect transistor is an NMOS transistor and the source/drain layer 216 is made of carbon silicon. Usually, the structure of germanium silicon is represented by $Si_XC_{1-X}$ or directly represented by SiC, wherein the range of X is from 0 to 1. Moreover, the structure of the source/drain layer 216 can be, for example, an epitaxial structure. The method for forming the source/drain layer 216 can be, for example, a selective epitaxial deposition for growing up carbon silicon only on silicon without depositing on silicon oxide or silicon nitride. That is, carbon silicon only grows up in the recession 214 and does not grow up at the isolation structures 202, the offset spacer 208a and the first spacer 208b. Therefore, during the selective epitaxial deposition, a semiconductor layer 217 made of the material as same as that of the source/drain layer 216 is formed on the gate electrode 204b. Additionally, the source/drain layer 216 can, for example, have N-type dopants therein. The N-type dopants can be, for example, in-situ implanted into the source/drain layer 216 as the source/drain layer 216 is formed. Alternatively, the N-type dopants can be, for example, non-insitu implanted into the source/drain layer 216 after the source/drain layer 216 is formed. Furthermore, the N-type dopants can be, for example, phosphorous ions or arsenic ions.

Figure 2E:
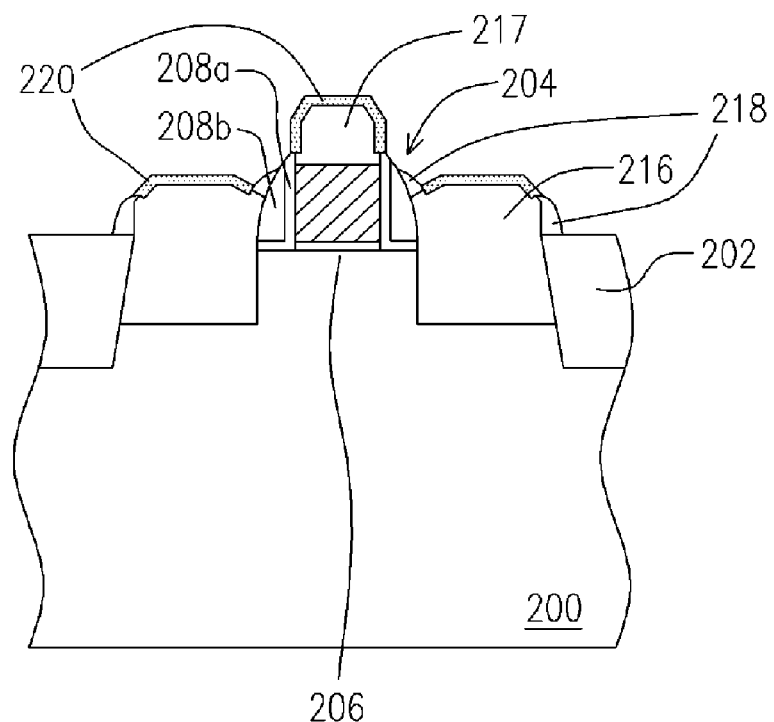
Figure 2E:
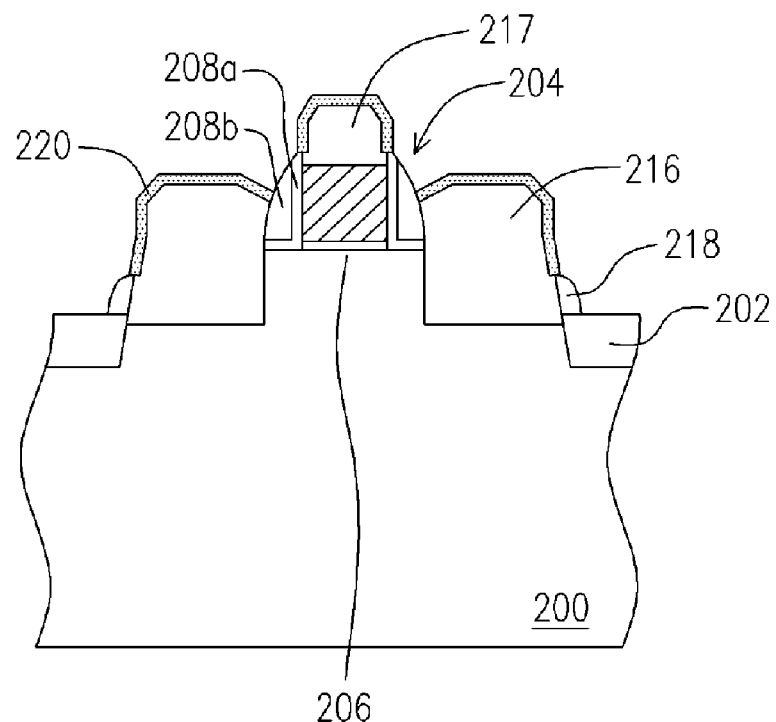

As shown in FIG. 2E, a second spacer 218 is formed at the sidewall of the source/drain layer 216 and the isolation structures 202. The material of the second spacer 218 can be, for example, silicon nitride or silicon oxide and the method forming the second spacer 218 comprises forming an insulating layer (not shown) on the structure shown in FIG. 2D and then performing an anisotropic etching process until the isolation structures 202, the semiconductor layer 217 and the source/drain layer 216 are exposed to form the second spacer 218 at the border between the isolation structures 202 and the source/drain layer 216.

Then, a metal silicide layer 220 is formed on the semiconductor layer 217 and the source/drain layer 216 to decrease the contact resistance between the later formed contact and the source/drain layer 216. The metal silicide layer 220 can be, for example, made of nickel silicide or cobalt silicide and the method for forming the metal silicide 220 can be, for example, a salicide process.

It should be noticed that, before the second spacer 218 is formed, a portion of the isolation structures 202 is removed to increase the step height between the top surface of the isolation structures 202 and that of the source/drain layer 216. By increasing the step height between the top surface of the isolation structures 202 and that of the source/drain layer 216, a portion of the insulating layer on the surface of the first spacer 208b can be completely remove and rest portion of the insulating layer is located at the sidewall of the source/drain layer 216 during the step of forming the second spacer 218 is performed. Since the second spacer 218 is not formed at the surface of the first spacer 208b, the exposed area of the source/drain layer 216 is increased to provide relatively large process window for forming the contact at the source/drain layer 216 in later process, as shown in FIG. 2E'.

The metal-oxide semiconductor field effect transistor of the present invention has the second spacer formed at the sidewall of the source/drain layer and the isolation structures so that the metal silicide is blocked to be formed at the border between the isolation structures and the source/drain layer. Hence, the substrate can be prevented from being electrically connected to the metal silicide and the junction leakage can be avoided.

The Second Embodiment

FIGS. 3A through 3D are cross-sectional views showing a method for forming a metal-oxide semiconductor field effect transistor according to a second embodiment of the invention.

Figure 3A:
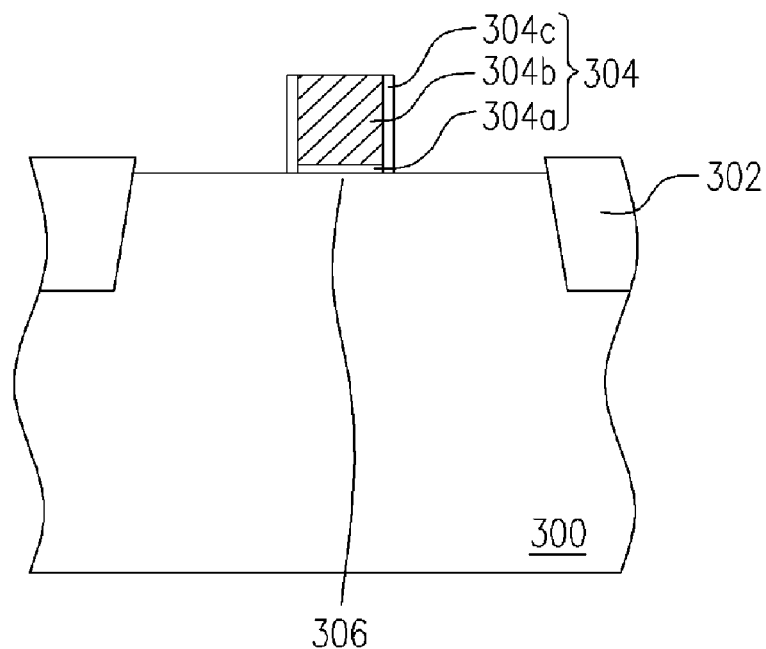
FIGS. 3A through 3D are cross-sectional views showing a method for forming a metal-oxide semiconductor field effect transistor according to a second embodiment of the invention.

As shown in FIG. 3A, a substrate 300 is provided, wherein the substrate 300 can, for example, have isolation structures 302 and a gate structure 304 formed thereon. The gate structure 304 is located at a portion of the substrate 300 between the isolation structures 302. The gate structure 304 is comprised of a gate dielectric layer 304a, a gate electrode 304b and an offset spacer 304c. The gate dielectric layer 304a is located between the gate electrode 304b and the substrate 300 and the offset spacer 304c is located at the sidewall of the gate electrode 304b. The material of the gate dielectric layer 304a can be, for example, silicon oxide and the material of the gate electrode 304b can be, for example, doped polysilicon. The offset spacer 304c can be, for example, made of silicon nitride. Furthermore, a portion of the substrate 300 under the gate structure 304 is used as a channel region 306 of this metal-oxide semiconductor field effect transistor.

Figure 3B:
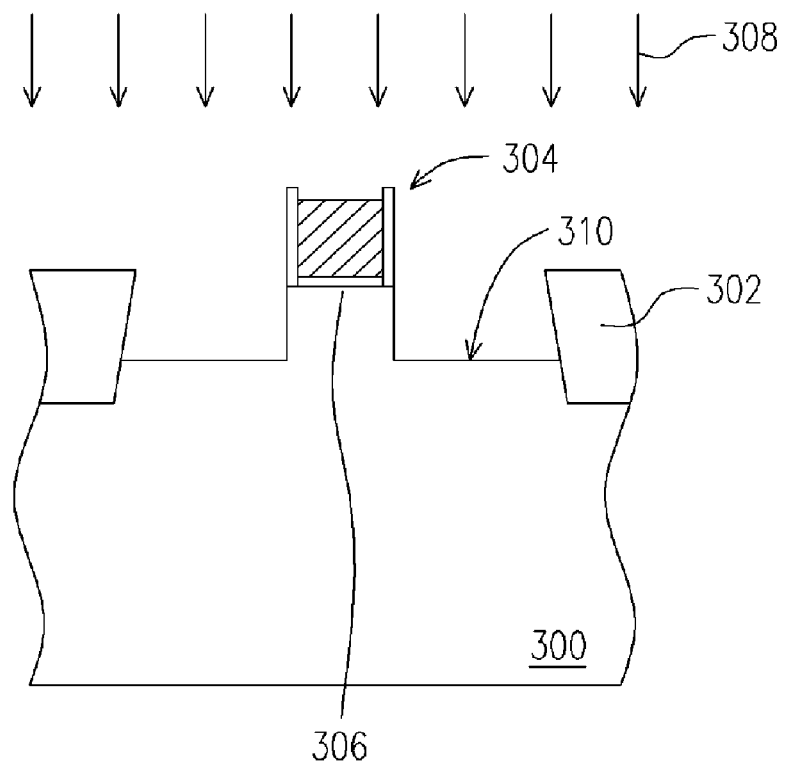

Then, as shown in FIG. 3B, a dry etching process 308 is performed to remove a portion of the substrate to form a recession 310 between the gate structure 304 and the isolation structures 302. The dry etching process 308 can be, for example, a reactive ion etching process and the reactive gas of the dry etching process 308 can be, for example, hexafluoroethane ($C_2F_6$) and helium. It should be noticed that a portion of the gate electrode 304b of the gate structure 304 is removed during the dry etching process 308.

Figure 3C:
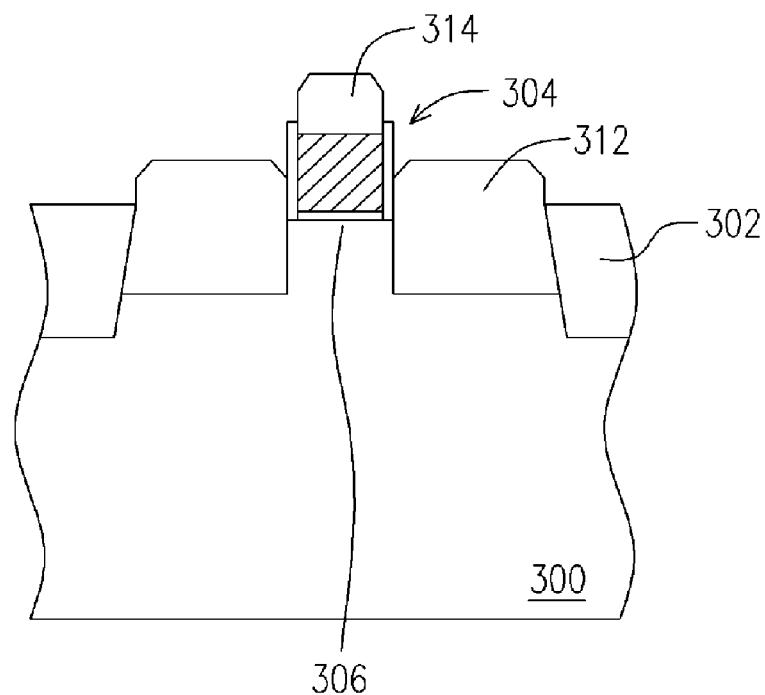

As shown in FIG. 3C, a source/drain layer 312 is formed in the recession 310. In one embodiment, the method for forming the metal-oxide semiconductor field effect transistor further comprises forming a lightly doped source/drain extension region between the channel region 306 and the recession 310 to avoid the short channel effect. The method for forming the source/drain extension region can be, for example, a bevel ion implantation process.

In one embodiment, this metal-oxide semiconductor field effect transistor is a PMOS transistor and the source/drain layer 312 is made of germanium silicon. Moreover, the structure of the source/drain layer 216 can be, for example, an epitaxial structure. The method for forming the source/drain layer 312 can be, for example, a selective epitaxial deposition for growing up germanium silicon only on silicon without depositing on silicon oxide or silicon nitride. That is, germanium silicon only grows up in the recession 310 and on the gate electrode 304b and does not grow up at the isolation structures 302 and the offset spacer 304c. Therefore, during the selective epitaxial deposition, a semiconductor layer 314 made of the material as same as that of the source/drain layer 312 is formed on the gate electrode 304b. Additionally, the source/drain layer 312 can, for example, have P-type dopants therein. The P-type dopants can be, for example, in-situ implanted into the source/drain layer 312 as the source/drain layer 312 is formed. Alternatively, the P-type dopants can be, for example, non-insitu implanted into the source/drain layer 312 after the source/drain layer 312 is formed. Furthermore, the P-type dopants can be, for example, boron ions.

As shown in FIG. 3C, in another embodiment, this metal-oxide semiconductor field effect transistor is an NMOS transistor and the source/drain layer 312 is made of carbon silicon. Moreover, the structure of the source/drain layer 216 can be, for example, an epitaxial structure. The method for forming the source/drain layer 312 can be, for example, a selective epitaxial deposition for growing up carbon silicon only on silicon without depositing on silicon oxide or silicon nitride. That is, carbon silicon only grows up in the recession 310 and on the gate electrode 304b and does not grow up at the isolation structures 302 and the offset spacer 304c. Therefore, during the selective epitaxial deposition, a semiconductor layer 314 made of the material as same as that of the source/drain layer 312 is formed on the gate electrode 304b. Additionally, the source/drain layer 312 can, for example, have N-type dopants therein. The N-type dopants can be, for example, in-situ implanted into the source/drain layer 312 as the source/drain layer 312 is formed. Alternatively, the N-type dopants can be, for example, non-insitu implanted into the source/drain layer 312 after the source/drain layer 312 is formed. Furthermore, the N-type dopants can be, for example, phosphorous ions or arsenic ions.

Figure 3D:
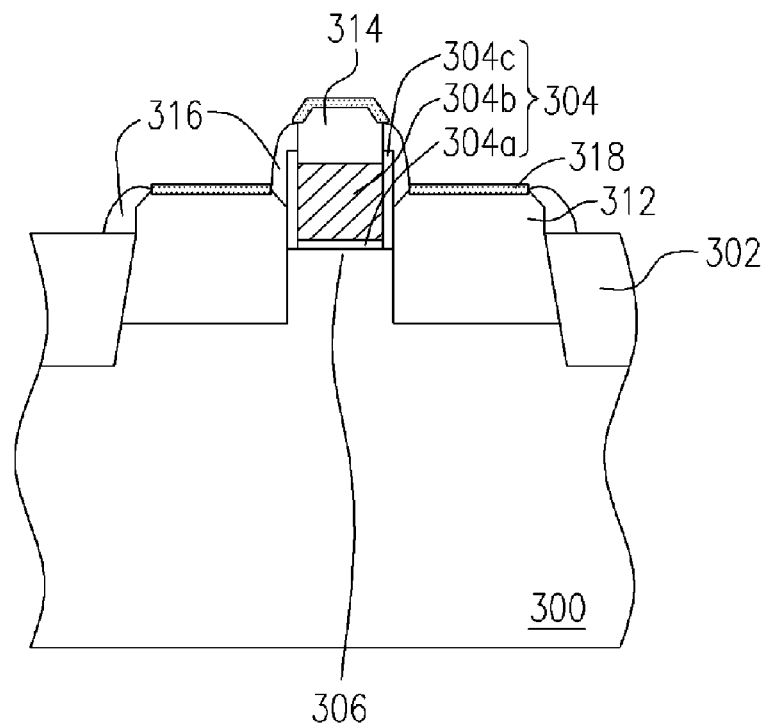

As shown in FIG. 3D, a spacer 316 is formed at the sidewall of the gate structure 304, the sidewall of the source/drain layer 312 and the isolation structures 302. The material of the spacer 316 can be, for example, silicon nitride or silicon oxide and the method forming the second spacer 316 comprises forming an insulating layer (not shown) on the structure shown in FIG. 3C and then performing an anisotropic etching process until the semiconductor layer 314 and the source/drain layer 312 are exposed to form the spacer 316 at the border between the isolation structures 302 and the source/drain layer 312. Furthermore, a portion of the spacer 316 is located at sidewall of the gate structure 304.

It should be noticed that, before the spacer 316 is formed, a portion of the isolation structures 302 is removed to increase the step height between the top surface of the isolation structures 302 and that of the source/drain layer 312. By increasing the step height between the top surface of the isolation structures 302 and that of the source/drain layer 312, the spacer 316 can be certainly formed at sidewall of the gate structure 304 and the border between the source/drain layer 312 and the isolation structures 302.

Then, a metal silicide layer 318 is formed on the semiconductor layer 314 and the source/drain layer 312 to decrease the contact resistance between the later formed contact and the source/drain layer 312. The metal silicide layer 318 can be, for example, made of nickel silicide or cobalt silicide and the method for forming the metal silicide 318 can be, for example, a salicide process.

The metal-oxide semiconductor field effect transistor of the present invention has the spacer formed at the sidewall of the source/drain layer and the isolation structures so that the metal silicide is blocked to be formed at the border between the isolation structures and the source/drain layer. Hence, the substrate can be prevented from being electrically connected to the metal silicide and the junction leakage can be avoided.

The following illustrates the structures of the metal-oxide semiconductor field effect transistors formed by using the aforementioned manufacturing methods respectively. As shown in FIG. 2E together with FIG. 3D, since the first spacer 208b is formed before the source/drain layer 206 is formed in the first embodiment and the source/drain layer 312 is formed at the sidewall of the gate structure 304 before the spacer 316 is formed in the second embodiment, the structures shown in FIG. 2E and FIG. 3D respectively are similar to each other but are formed by different manufacturing step order. Therefore, the description herein is based on the structure shown in FIG. 3D. Furthermore, the structures shown in FIG. 2E and FIG. 3D respectively are not limited to the manufacturing processes mentioned above.

As shown in FIG. 3D, the metal-oxide semiconductor field effect transistor comprises the substrate 300, the isolation structures 302, the gate structure 304, the source/drain layer 312, the semiconductor layer 314, the spacer 316 and the metal silicide layer 318. The substrate 300 can be, for example, a silicon based substrate. The gate structure 305 is located on the substrate 300 and is comprised of the gate dielectric layer 304a, the gate electrode 304b and the offset spacer 304c. The spacer 316 is located at the sidewall of the gate structure 304 and the sidewall of the source/drain layer 312 and the isolation structures 302. Further, the material of the spacer 316 can be, for example, silicon oxide or silicon nitride. The metal silicide layer 318 is located on the source/drain layer 312 and the semiconductor layer 314 and the material of the metal silicide layer 318 can be, for example, nickel silicide or cobalt silicide.

The source/drain layer 312 is located at a portion of the substrate 300 adjacent to the gate structure 304 and the top surface of the source/drain layer 312 is higher than that of the isolation structures 302. The semiconductor layer 314 is located on the gate electrode 304b. The structures of the source/drain layer 312 and the semiconductor layer 314 can be, for example, expitaxial structures respectively. In one embodiment, if the metal-oxide semiconductor field effect transistor is a PMOS transistor, the source/drain layer 312 and the semiconductor layer 314 can be, for example, made of germanium silicon and can, for example, have P-type dopants herein. In another embodiment, if the metal-oxide semiconductor field effect transistor is an NMOS transistor, the source/drain layer 312 and the semiconductor layer 314 can be, for example, made of carbon silicon and can, for example, have N-type dopants herein.

As described above, in the present invention, the spacer is located at the sidewall of the source/drain layer and the isolation structures so that the metal silicide is not formed at the border between the isolation structures and the source/drain layer. Hence, the substrate can be prevented from being electrically connected to the metal silicide and the junction leakage can be avoided.

The Third Embodiment

FIGS. 4A through 4F are cross-sectional views showing a method for forming a complementary metal-oxide semiconductor field effect transistor according to a third embodiment of the invention.

Figure 4A:
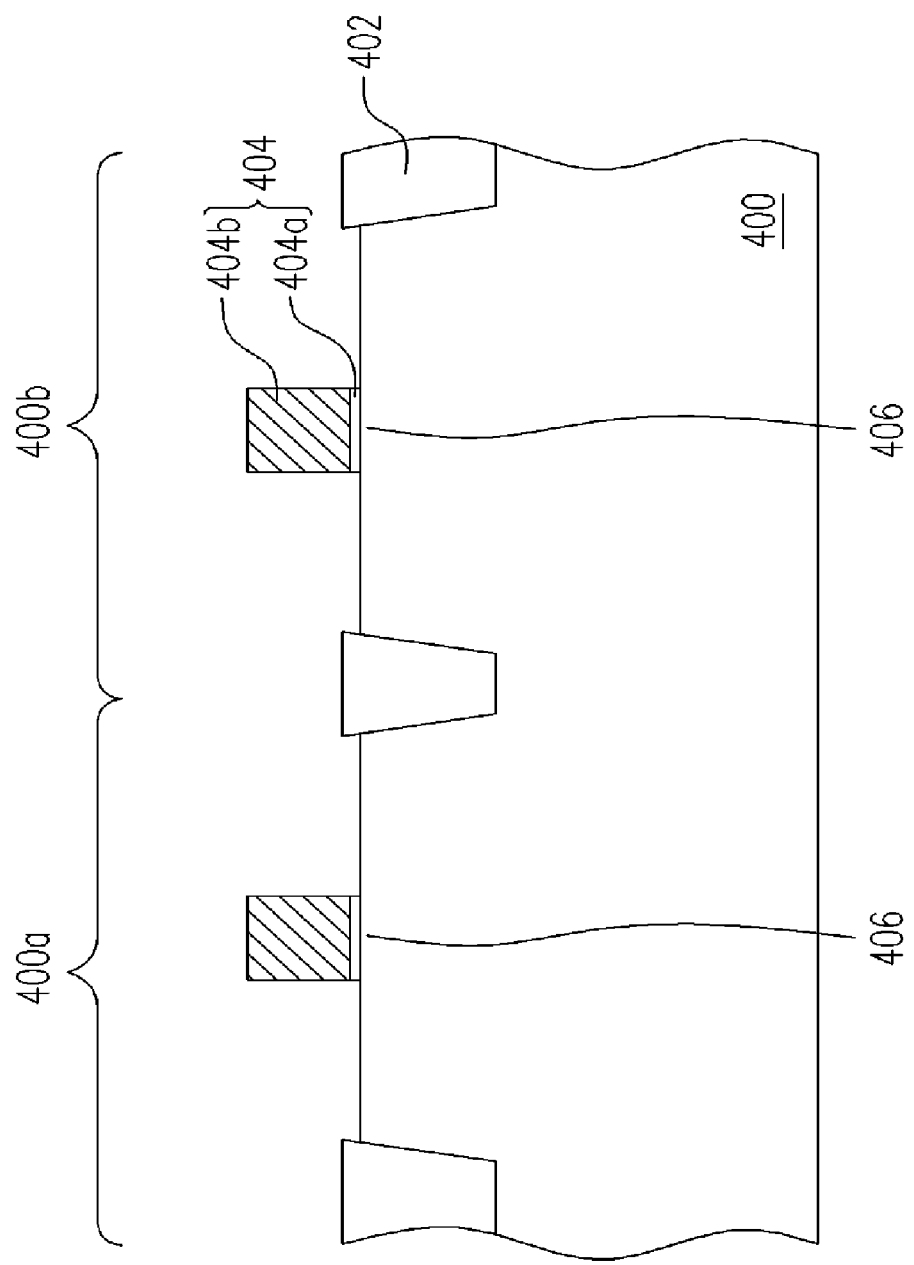
FIGS. 4A through 4F are cross-sectional views showing a method for forming a complementary metal-oxide semiconductor field effect transistor according to a third embodiment of the invention.

As shown in FIG. 4A, a substrate 400 is provided, wherein the substrate 400 has isolation structures 402 and gate structures 404 formed thereon. The substrate 400 has a first device region 400a and a second device region 400b. In this embodiment, the later performed processes are used to form an NMOS transistor in the first device region 400a and to form a PMOS transistor in the second device region 400b. The gate structures 404 are located at the first device region 400a and the second device region 400b respectively and each of the gate structures 404 is comprised of a gate dielectric layer 404a and a gate electrode 404b. The gate dielectric layer 404a is located between the gate electrode 404b and the substrate 400 and the material of the gate dielectric layer 404a can be, for example, silicon oxide and the material of the gate electrode 404b can be, for example, doped polysilicon. Moreover, a portion of the substrate under each of the gate structures 404 is used as a channel region 406 of the metal-oxide semiconductor field effect transistor.

Figure 4B:
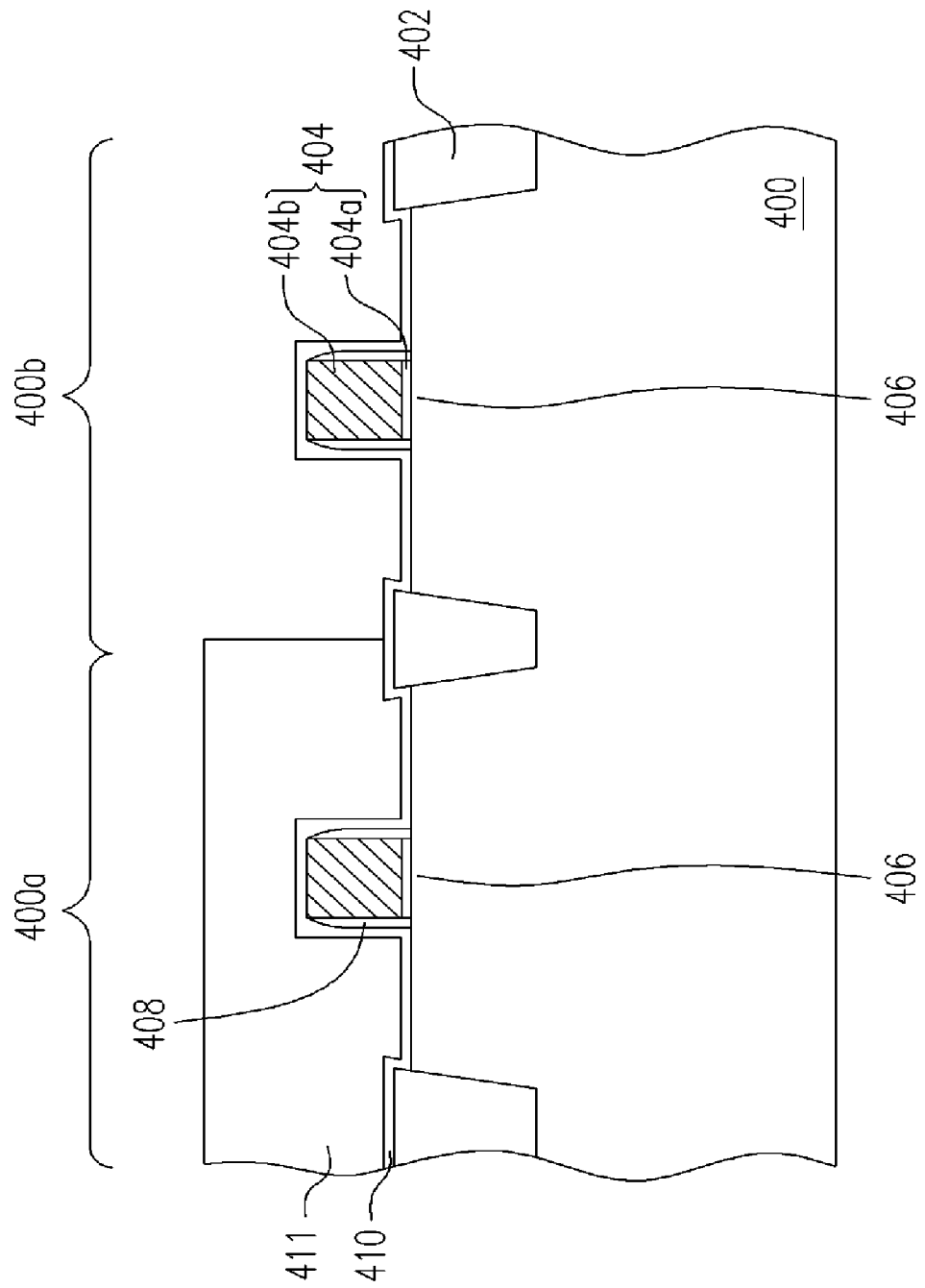

As shown in FIG. 4B, an offset spacer 408 is formed at the sidewall of the gate structures 404 and a cap layer 410 is formed to cover the substrate 400. The offset spacer 408 can be, for example, made of silicon nitride and the cap layer 410 can be, for example, made of silicon oxide. Then, in the first device region 400a, a patterned photoresist layer 411 is formed to over the substrate 400.

Figure 4C:
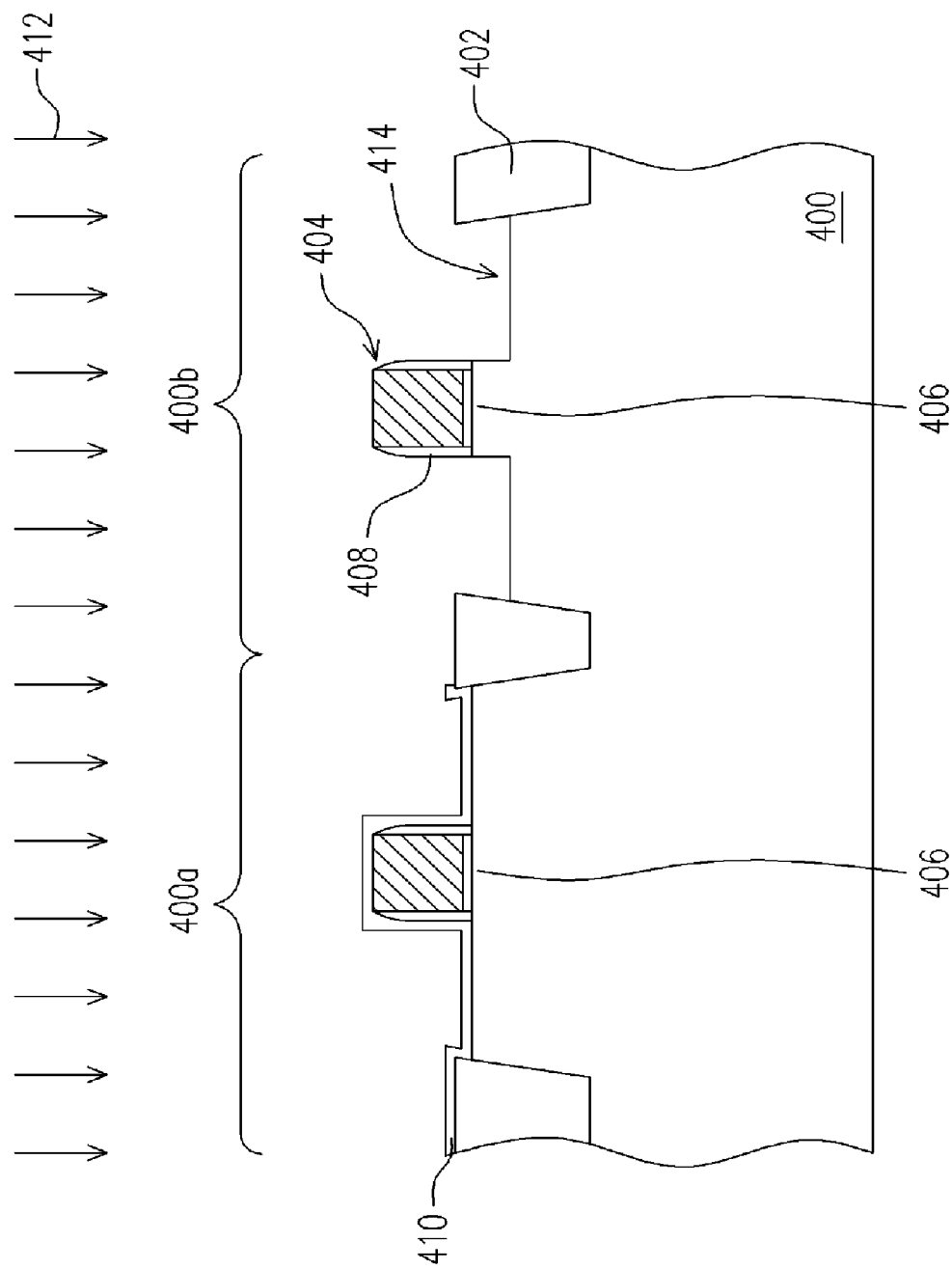

As shown in FIG. 4C, by using the patterned photoresist layer 411 as a mask, a wet etching process is performed to remove a portion of the cap layer in the second device region 400b. Thereafter, by using the cap layer 410 as a mask, a dry etching process 412 is performed to remove a portion of the substrate 400 so as to form a recession 414 in a portion of the substrate 400 between the gate structure 404 and the isolation structures 402 in the second device region 400b. The dry etching process 412 can be a reactive ion etching process and the reactive gas of the dry etching process 412 can be, for example, hexafluoroethane ($C_2F_6$) and helium.

Figure 4D:
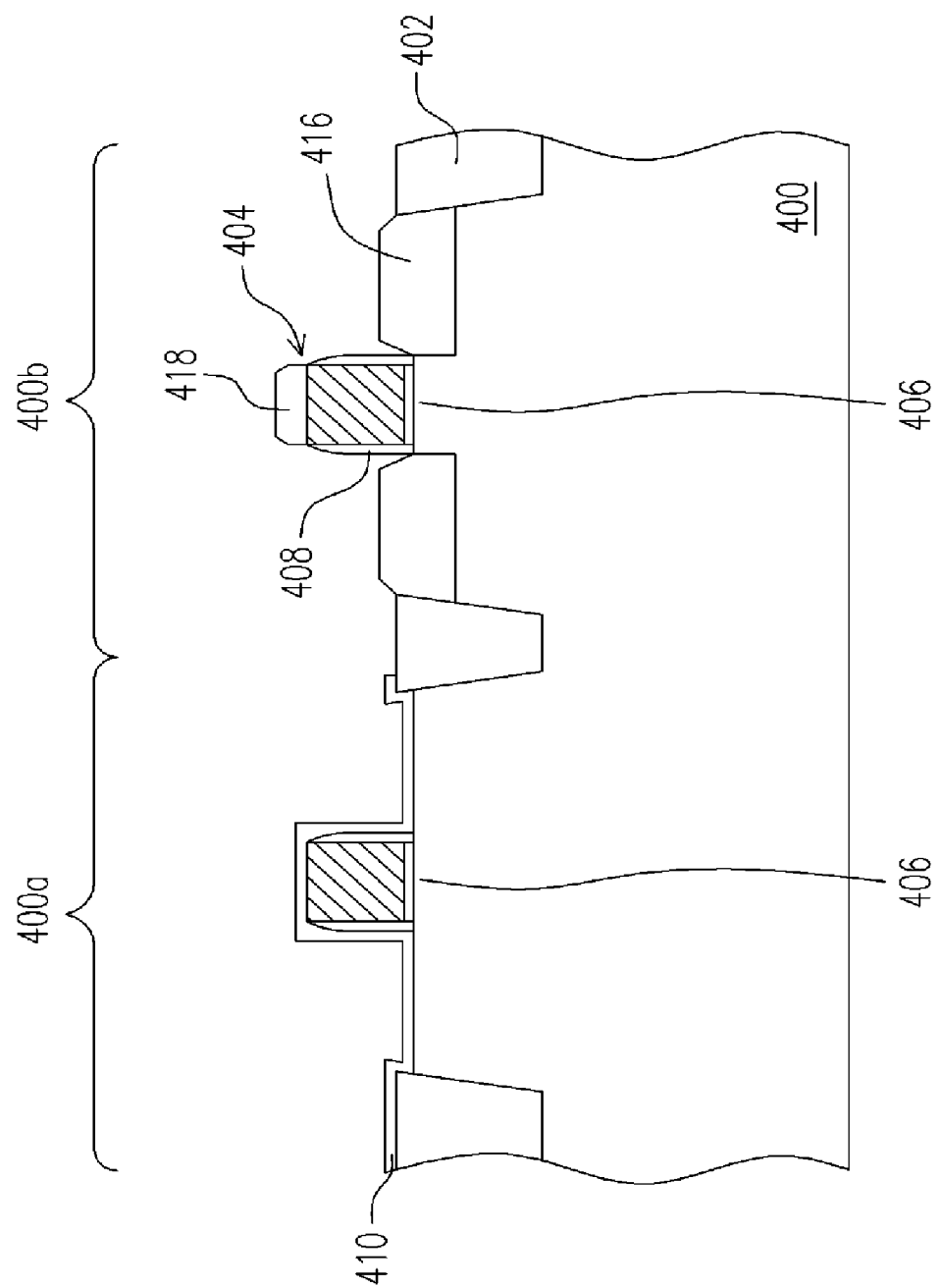

As shown in FIG. 4D, a source/drain layer 416 is deposited in the recession 414. In one embodiment, the manufacturing process of this complementary metal-oxide semiconductor field effect transistor further comprises a step of forming a lightly doped source/drain extension region between the channel region 406 and the recession 416 in the second device region 400b to avoid the short channel effect. The method for forming the source/drain extension region can be, for example, a bevel ion implantation.

The material of the source/drain layer 416 can be, for example, germanium silicon. Moreover, the structure of the source/drain layer 416 can be, for example, a epitaxial structure. The method for forming the source/drain layer 416 can be, for example, a selective epitaxial deposition for growing up germanium silicon only on silicon without depositing on silicon oxide or silicon nitride. That is, germanium silicon only grows up in the recession 414 and on the gate electrode 404b and does not grow up at the isolation structures 402 and the offset spacer 408. Therefore, during the selective epitaxial deposition, a semiconductor layer 418 made of the material as same as that of the source/drain layer 416 is formed on the gate electrode 404b in the second device region 400b. Additionally, the source/drain layer 416 can, for example, have P-type dopants therein. The P-type dopants can be, for example, boron ions. The P-type dopants can be, for example, in-situ implanted into the source/drain layer 416 as the source/drain layer 416 is formed. Alternatively, the P-type dopants can be, for example, non-insitu implanted into the source/drain layer 416 after the source/drain layer 416 is formed.

Figure 4E:
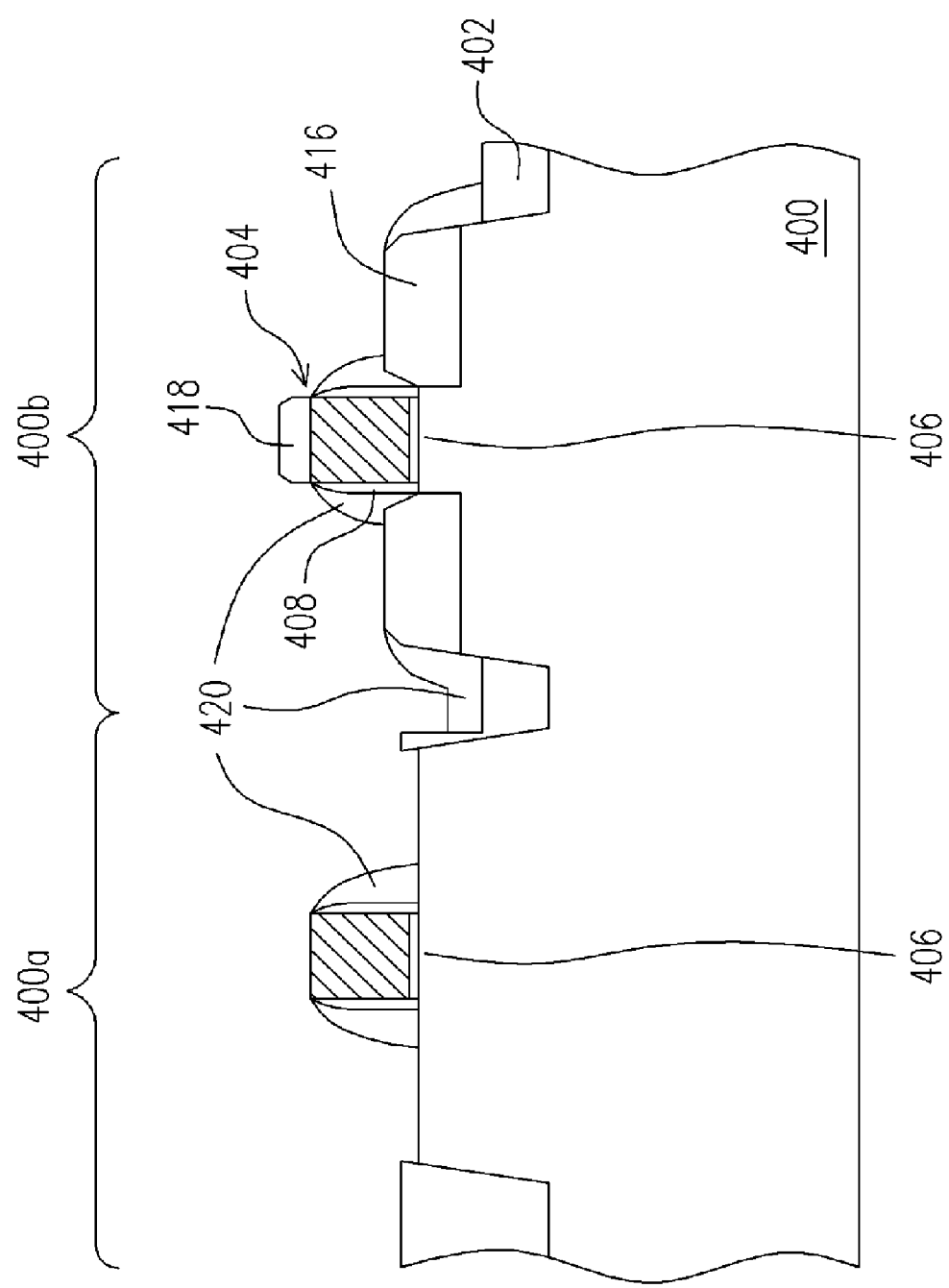

As shown in FIG. 4E, the cap layer 410 in the first device region 400a is removed. It should be noticed that, at the time for removing the cap layer 410 in the first device region 400a, a portion of the isolation structures 402 in the second device region 400b is removed as well so that the step height between the top surface of the isolation structures 402 and that of the source/drain layer 416 is increased. Therefore, it is beneficial for the later formed spacer in the second device region 400b. Then, a spacer 420 is formed on the sidewalls of the offset spacers 408 in both of the first device region 400a and the second device region 400b and on the sidewall of the source/drain layer 416 and on the isolation structures 402.

Figure 4F:
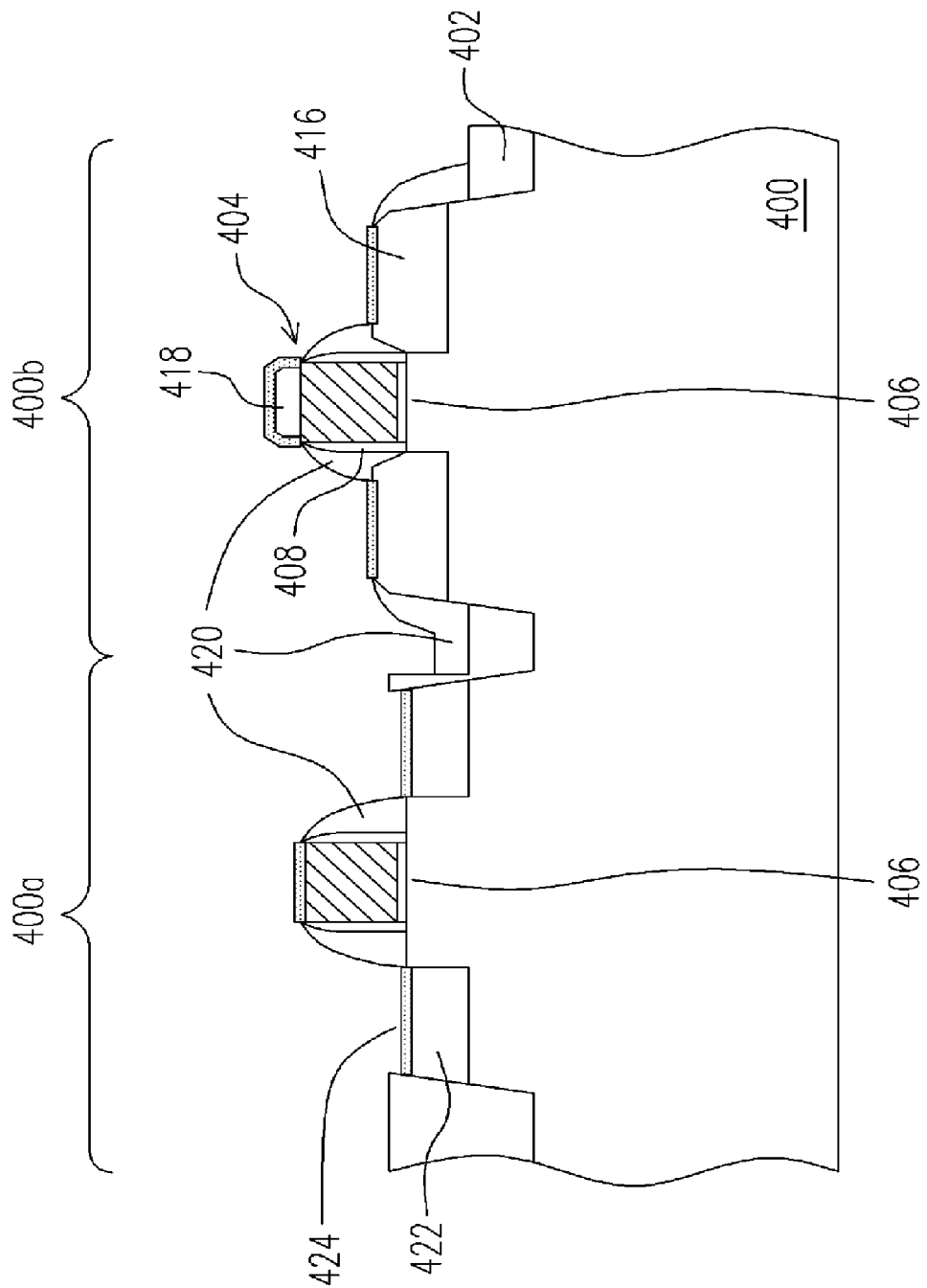

As shown in FIG. 4F, a patterned photoresist layer (not shown) is formed to cover the second device region 400b and an ion implantation process is performed to from a source/drain region 422 in the substrate 400 adjacent to the spacer 420 in the first device region 400a. The dopants for forming the source/drain region 422 can be, for example, phosphorous ions or arsenic ions. Then, the patterned photoresist layer is removed. In one embodiment, the manufacturing process for forming the complementary metal-oxide semiconductor field effect transistor further comprises forming a lightly doped source/drain extension region between the source/drain region 422 and the channel region 406 in the first device region 400a to avoid short channel effect. The method for forming the source/drain extension region can be, for example, a bevel ion implantation.

Thereafter, a metal silicide layer 424 is formed on the gate electrode 404b in the first device region 400a and on the source/drain layer 416, the semiconductor layer 418 and the source/drain region 422. The material of the metal silicide layer 424 can be, for example, nickel silicide or cobalt silicide and the method for forming the metal silicide layer 424 can be, for example, a salicide process. Since the spacer 420 is formed at the sidewall of the source/drain layer 416 and the isolation structures 402 in the second device region 400b, the metal silicide layer 424 does not grow at the border between the source/drain layer 416 and the isolation structures 402. Therefore, the junction leakage can be avoided.

Alternatively, for a complementary metal-oxide semiconductor field effect transistor in another embodiment, an NMOS transistor is formed in the second device region 400b and a PMOS transistor is formed in the first device region 400a. The material of the source/drain layer 416 of this complementary metal-oxide semiconductor field effect transistor can be, for example, carbon silicon and the structure of the source/drain layer 416 can be, for example, an epitaxial structure. The source/drain layer 416 can, for example, have N-type dopants, such as phosphorous ions or arsenic ions, implanted therein. Furthermore, the source/drain region 422 can, for example, have boron ions doped therein. Moreover, the method for forming the aforementioned complementary metal-oxide semiconductor field effect transistor is similar to the aforementioned manufacturing method and are not described herein.

In the other embodiment, the materials of the source/drain layers of the NMOS transistor and the PMOS transistor of this complementary metal-oxide semiconductor field effect transistor can be, for example, carbon silicon and germanium silicon respectively. The structures of the source/drain layers of the NMOS transistor and the PMOS transistor can be, for example, the epitaxial structures respectively. Furthermore, the source/drain layers of the NMOS transistor and the PMOS transistor can, for example, have N-type dopants and P-type dopants doped therein respectively. On the other words, the manufacturing process applied on the second device region 400b can be also applied for forming the NMOS transistor and the PMOS transistor mentioned herein.

Altogether, in the present invention, the spacer is formed at the sidewall of the source/drain layer and on the isolation structures so that the metal silicide can be blocked from being formed at the border between the source/drain layer and the isolation structure. Therefore, the substrate can be prevented from being electrically connected to the metal silicide layer and the junction leakage can be avoided.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A metal-oxide semiconductor field effect transistor, comprising:
   a substrate;
   a plurality of isolation structures located in the substrate and having a first top surface respectively;
   a gate structure located on a portion of the substrate between the isolation structures and having two first sidewalls;
   a source/drain layer having a second top surface and two second sidewalls and located on a portion of the substrate between the gate structure and the isolation structures, wherein the second top surface of the source/drain layer is higher than the first top surfaces of the isolation structures;
   a first spacer located at the first sidewalls of the gate structure; and
   a second spacer located at the second sidewalls of the source/drain layer and over the first top surfaces of the isolation structures.

2. The metal-oxide semiconductor field effect transistor of claim 1, wherein the source/drain layer includes epitaxial structure.

3. The metal-oxide semiconductor field effect transistor of claim 1, wherein a material of the source/drain includes germanium silicon.

4. The metal-oxide semiconductor field effect transistor of claim 1, wherein the first top surfaces of the isolation structures are lower than a bottom of the gate structure.

5. The metal-oxide semiconductor field effect transistor of claim 1, further comprising a third spacer located at the first sidewalls of the gate structure, wherein the gate structure and the source/drain layer are separated by the third spacer directly.

6. The metal-oxide semiconductor field effect transistor of claim 1, wherein the first top surfaces of the isolation structures are lower than a bottom of the source/drain layer.

* * * * *